United States Patent [19]

Keller

[11] 3,858,549

[45] Jan. 7, 1975

[54] APPARATUS FOR CONTROLLED DOPING OF SEMICONDUCTOR CRYSTALS

[75] Inventor: Wolfgang Keller, Munich, Germany

[73] Assignee: Siemens Aktiengesellschaft, Berlin & Munich, Germany

[22] Filed: Oct. 30, 1973

[21] Appl. No.: 411,089

Related U.S. Application Data

[62] Division of Ser. No. 280,853, Aug. 15, 1973, Pat. No. 3,804,682.

[52] U.S. Cl. .............................................. 118/49.1

[51] Int. Cl. ............................................ C23c 13/08

[58] Field of Search ............ 118/4, 7, 8, 5, 48–49.5; 117/106–107.2; 23/301 SP, 273 SP; 148/1.6, 189, 171, 175

[56] References Cited

UNITED STATES PATENTS

| | | | |
|---|---|---|---|
| 2,897,329 | 7/1959 | Matare | 148/1.6 X |
| 3,108,073 | 10/1963 | Vanik et al. | 148/1.6 UX |
| 3,141,848 | 7/1964 | Enk et al. | 148/171 X |
| 3,558,376 | 1/1971 | Schmidt | 148/189 |

*Primary Examiner*—Morris Kaplan
*Attorney, Agent, or Firm*—Hill, Gross, Simpson, Van Santen, Steadman, Chiara & Simpson

[57] ABSTRACT

Method and apparatus for controlled doping of semiconductor crystals whereby a semiconductor crystal is enclosed in a housing and a floating melt zone is established along the length thereof while simultaneously controlled volumes of a gaseous doping substance is directed by a conduit to the melt zone for diffusion within the resolidified semiconductor crystals. The volume of doping substance supplied to the crystal is regulated by combination pressures and feed rates, such as by combination of at least two valves having a constant volume chamber therebetween and a program that adjusts the pressure of the dopant supply above the pressure surrounding the crystal melt zone and regulates the frequency of valve operations per unit time. The invention is especially useful for producing n-doped silicon crystals.

7 Claims, 6 Drawing Figures

Patented Jan. 7, 1975

3,858,549

3 Sheets-Sheet 1

APPARATUS FOR CONTROLLED DOPING OF SEMICONDUCTOR CRYSTALS

This is a division, of application Ser. No. 280,853 filed Aug. 15, 1973, now U.S. Pat. No. 3,804,682.

BACKGROUND OF THE INVENTION

1. Field of the Invention

The invention relates to doping of semiconductor crystals and more particularly to an apparatus for controlled diffusion of a doping material into a semiconductor crystal undergoing a floating melt zone purification.

2. The Prior Art

Generally, doping of semiconductor crystals occurs during formation of the semiconductor crystals, such as during the condensation of gaseous semiconductor materials onto a heated substrate composed of the semiconductor material. A select dopant (doping material) is mixed with the gaseous semiconductor material and deposited on the substrate. The resultant crystals are of polycrystalline structure and must be processed or purified in subsequent zone melting operations to form a single crystalline structure. During such reprocessing, the concentration of dopant within the semiconductor often changes in an unpredictable manner. Generally, much higher dopant concentrations must be initially provided so that the final product contains the desired concentration of doping material, even after a plurality of zone melt purifications. Such methods are time-consuming and do not allow reproducible results to be attained.

German Offenlegungsschrift 1,544,276 suggests a method for producing doped semiconductor crystals wherein a doping material is converted to a gaseous state and then directed through a conduit into the vicinity of a semiconductor melt zone. The dopant is thus incorporated within the resolidified portion of the semiconductor. The amount of dopant gas supplied to the semiconductor crystal is primarily regulated by a single valve positioned between the dopant supply and the semiconductor melt zone. The amount of dopant gas is also controlled by regulating the amount of doping materials converted to gas and by regulating the pressure within the dopant gas supply chamber. Generally, this chamber is maintained at a constant temperature so that an amount of dopant gas is always present. The dopant suggested for use with this method is a readily vaporizable and easy-to-handle compounds of boron and phosphorous, such as trimeric phosphornitrilochloride.

A substantial disadvantage of the above described doping method is that the regulating valve that controls the amount of dopant supplied to the semiconductor melt zone generally comprises a conventional needle valve in an electrically controlled magnetic valve means. Such valves are incapable of precise adjustment and/or volume regulation since they do not function in a precise mechanical manner. Accordingly, reproducible dopant concentrations in semiconductor members is not obtainable.

SUMMARY OF THE INVENTION

The invention provides a novel means of doping semiconductor crystals wherein reproducible doping concentrations within the crystals are readily attained.

It is a novel feature of the invention to establish a first pressure in a gaseous dopant supply and a second pressure about a crystal melt zone so that the first pressure is greater than the second pressure, to isolate a given or constant value of the gaseous dopant while adjusting the pressure of such given volume to a value between the first and second pressure and to deliver the given volume of gaseous dopant at a select rate to the crystal melt zone.

It is another novel feature of the invention to provide in a floating melt zone apparatus, a combination of at least two valves with a constant volume chamber therebetween at a location between a semiconductor melt zone and a dopant supply.

It is a further novel feature of the invention to regulate the volume of gaseous dopant supplied to a semiconductor melt zone by a given program that regulates the pressure of the gaesous dopant in a supply thereof in relation to the pressure about the crystal melt zone and to regulate the delivery rate of the dopant to the melt zone, as by the number of valve operations per unit time so that the dopant gas is discontinuously removed from the supply thereof in exactly measurable portions defined by the volume released by each valve operation.

It is yet another novel feature of the invention to maintain a pressure within a dopant supply above the pressure surrounding a semiconductor melt zone. In preferred embodiments, the pressure within the dopant supply is maintained at about $10^{-2}$ Torr and the pressure about the semiconductor melt zone is maintained at about $10^{-5}$ Torr.

It is yet another novel feature of the invention to provide within a dopant supply conduit of a floating melt zone apparatus a combination of the hereinabove-mentioned two valves with a constant volume chamber therebetween and at least two additional valves with an additional constant volume chamber therebetween so as to enlarge the dilution factor of the dopant before it contacts the crystal melt zone.

It is yet a further novel feature of the invention to utilize a rotary controlled multi-stage valve in the embodiments thereof that include two constant volume chambers and to utilize a rotary controlled double valve or an electromagnetically controlled double valve in embodiments thereof that include a single constant volume chamber. Mechanically controlled valves, such as actuated by a cam shaft or the like are also utilizable.

DESCRIPTION OF THE PREFERRED EMBODIMENTS

Figure 1:
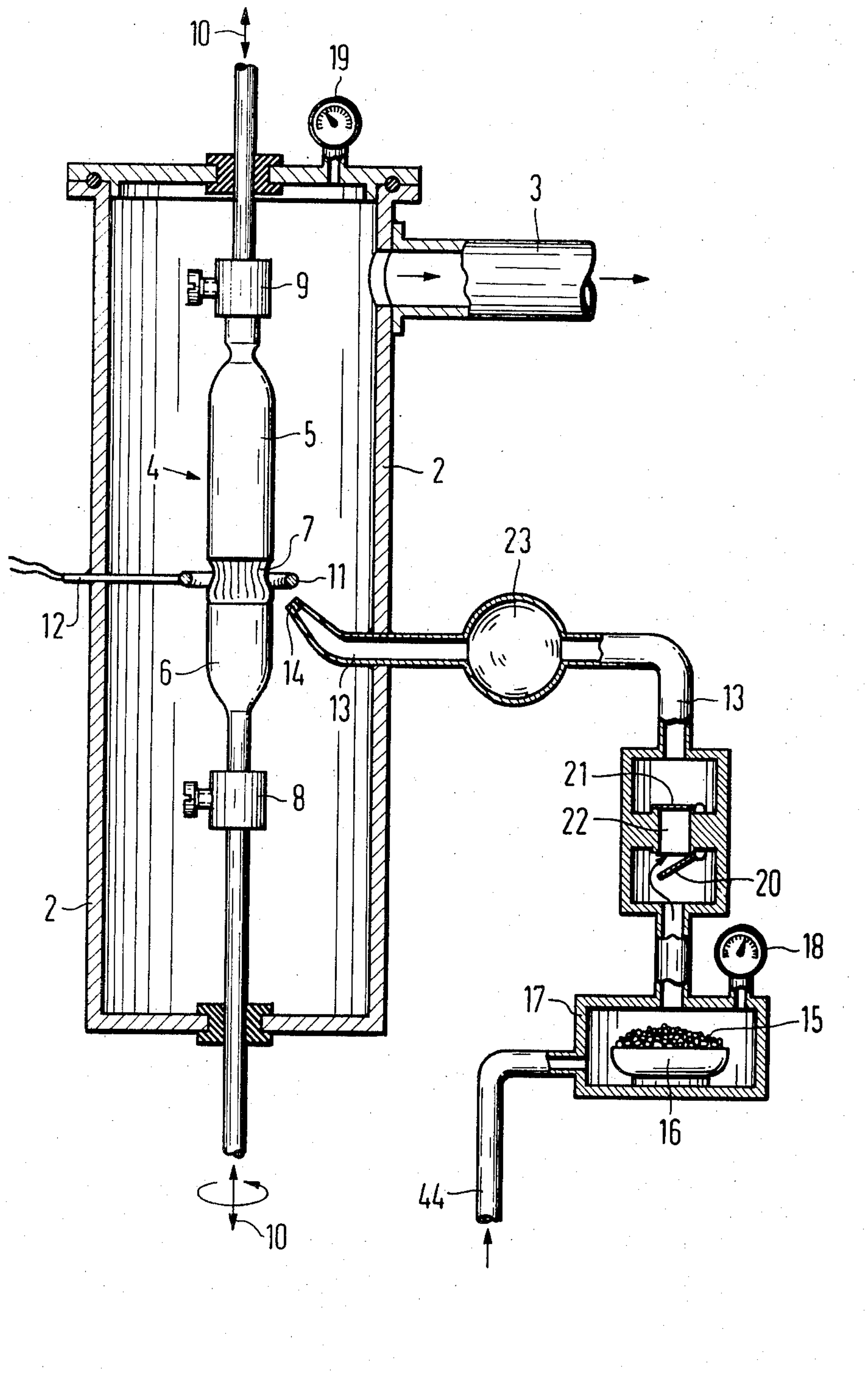
FIG. 1 is a partial elevated sectional view of an exemplary apparatus embodiment constructed in accordance with the principles of the invention.

The invention provides an apparatus for direct diffusion of doping material into semiconductor crystals during a floating melt zone operation. The dopant is vaporized and directed via a conduit to the semiconductor melt zone in precisely controllable volumes. A combination of pressures and delivery rates of the gaseous dopant allows highly reproducible results to be obtained. The means of attaining the desired control of the gaseous dopant includes a combination of at least two valves having a constant volume chamber therebetween positioned within a dopant conduit located between the dopant supply and the semiconductor melt zone. The volume of dopant gas delivered to the semiconductor melt zone is regulated by a program that adjusts the pressure within the dopant supply in relation to the pressure about the semiconductor melt zone and adjusts the frequency of valve operation per unit of time. Preferably, the pressure within the dopant supply is maintained above the pressure surrounding the semiconductor melt zone by a factor of at least 10 and the frequency of valve operation per unit time is maintained at one to 50 operations per second.

The dopant materials utilized in the practice of the invention are preferably vaporizable dopant materials. A preferred family of this class of materials comprises readily vaporizable hydrogen compounds, such as hydrogen compounds of phosphorous, for example $PH_3$; hydrogen compounds of boron, such as $B_2H_6$; hydrogen compounds of arsenic, such as $AsH_3$; and hydrogen compounds of antimony, such as $SbH_3$. A particularly preferred vaporizable dopant material is readily vaporizable trimeric phosphornitrilochloride, $PN(Cl_2)_3$, because it is non-poisonous, easy to handle and is resistant to humidity and atmosphere (air). Further, $PN(Cl_2)_3$ is easily purified, especially by recrystallization from benzene and/or vacuum sublination and is characterized by a favorable vapor pressure of $5 \cdot 10^{-3}$ Torr at 20°C.

Generally, the method utilizing the embodiments of the invention comprise establishing a first pressure in a gaseous dopant supply and a second pressure about a semiconductor crystal melt zone. The pressures are then adjusted so that the first pressure is greater than the second pressure. A given or constant volume of gaseous dopant is then isolated from its supply and the pressure thereof is adjusted to a value between that of the first and second pressures. Then, the given volume of gaseous dopant is delivered at a select rate to the crystal melt zone. Precise control of the volume of dopant delivered to a melt zone provides highly reproducible results. The pressure of the given or constant volume of gaseous dopant is, in certain embodiments, gradually decreased so that it approaches the pressure about the crystal melt zone and an increased dilution factor of the dopant is thereby achieved. In the preferred method embodiments, the first pressure is greater than the second pressure by a factor of at least 10 and the rate of gaseous dopant delivered to the crystal melt zone is about one to 50 volumes per second.

Generally, the apparatus embodiments of the invention comprise a floating melt zone apparatus in combination with at least two valves having a constant volume chmber therebetween.

An exemplary apparatus embodiment includes a housing with a reaction chamber therein having a gas inlet and outlet. Movable mounting means are located within the reaction chamber and along opposite surfaces thereof for supporting a semiconductor crystal therebetween. A heating means is positioned within the chamber so as to surround a portion of the crystal and define a melt zone thereon. A dopant supply container is positioned remote from the reaction chamber and includes a given amount of a vaporizable doping material and a means for maintaining a constant temperature therein. A dopant conduit connects the dopant supply chamber with the reaction chamber. One end of the dopant conduit terminates in the vicinity of the crystal melt zone. At least one combination comprised of at least two valves having a constant volume chamber therebetween is located within the dopant conduit and between the reaction chamber and the dopant supply chamber. Means for regulating the delivery rate of dopant, such as for controlling the valve operations, i.e., opening and closing the valves, in accordance with a select program and a means for adjusting the pressure within the reaction chamber and within the dopant supply chamber are included in working relationwith the apparatus.

The invention includes apparatus embodiments utilizing a plurality of combinations comprised of at least two valves having a constant volume chamber therebetween in a dopant supply conduit so as to enlarge the dilution factor of the dopant. Apparatus embodiments utilizing such a plurality of valve-constant volume chamber combinations are safer than embodiments utilizing a single valve-constant volume chamber combination since arcing or the like at the induction heating coil, conventionally utilized in floating melt zone apparatus, is avoided by the multi-stage pressure decrease produced thereby.

Embodiments that include a plurality of valve-constant volume chamber combinations utilize, for example, rotary controlled multi-stage valves that include at least two constant volume chambers therein. Embodiments that include single valve-constant volume chamber combinations utilize, for example, a rotary controlled double valve or an electromagnetically controlled double valve with a constant volume chamber therebetween. The invention also includes valves that are controlled or activated by a mechanical means, for example, such as cam shafts.

During the doping operation in accordance with the invention, a pulling rate (for the floating melt zone on a semiconductor member) of about 1 to 5 mm is maintained.

The invention finds particular utility in producing n-doped silicon rods or the like and is easily regulated to yield fully reproducible results.

Referring now to FIG. 1, a housing 2 for a floating melt zone process is illustrated. The housing 2 includes an inner reaction chamber **2*a*, a gas inlet 44 and a gas outlet 3. The gas outlet 3 is connected with a source of vacuum (not shown). A n-doped silicon crystal rod 4 is positioned within the reaction chamber 2*a* on mounting means 8 and 9 respectively. The crystal rod 4 is composed of a storage portion 5, a recrystallized portion 6 and a melt zone 7. The mounting means 8 and 9 extend through opposing walls of housing 2 and are operationally connected for movement to a means 10 whereby at least one of the mounting means is rotatable about its axis and both of the mounting means are axially movable as diagrammatically indicated by the arrows associated with reference numeral 10. A heating means, such as an induction heating coil 11 that is provided with a high frequency current, is mounted within the chamber 2***a* on a suitable support means 12 so as to surround a portion of the crystal rod 4. Upon energization, the heating means creates the melt zone 7 on rod 4 and as the rod 4 is moved via means 10, melt zone 7 likewise moves or floats. This type of apparatus and/or process is thus known as a floating melt zone apparatus and/or process and will be so referred to in the specification and claims. A conduit 13 is positioned in working relation with the floating melt zone apparatus described so that one end 14 thereof, formed in the shape of a nozzle, terminates in the vicinity of the melt zone 7 (or the heating coil 11) so that any gas within the conduit 13 is directed to the melt zone.

A dopant supply 15, such is exemplary illustrated as a crucible 16 having a given amount of, say phosophornitrilochloride in a solid state, is placed within a dopant supply container 17. As shown, the dopant supply container 17 is located remote from the reaction housing 2 and conduit 13 interconnects the interior of the container 17 with the reaction chamber 2*a* of housing 2. The temperature within the container 17 and thus of dopant supply 15 is maintained at a constant value, say 17°C by conventional means (not shown). A monometer 18 is connected with the interior of chamber 17 to indicate a pressure therein and a monometer 19 is connected with the reaction chamber 2*a* to indicate the pressure therein.

The conduit 13 includes a first portion 13*b* in communication with the interior of container 17, a system or body 13*a* that includes at least two valves 20 and 21 with a constant volume chamber 22 therebetween, and a further portion 13*c* intercommunicating the system 13*a* with the chamber 2*a*. In certain embodiments, a gas expansion chamber 23 may be provided within conduit 13 and located between the system 13*a* and the chamber 2*a*.

Conduit 44 interconnects the interior of container 17 with a carrier gas supply (not shown). The carrier gas may comprise any suitable inert gas, for example, such as hydrogen, argon, etc. The carrier gas aids in transporting the gaseous dopant from its supply source, i.e., container 17 to the melt zone and the exits via conduit 3.

At the start of the doping process, the chamber 2*a* is evacuated by suitable means connected in working relationship therewith until the monometer 19 indicates a pressure $P_2$, i.e., about $10^{-5}$ Torr and the container 17 is evacuated until the monometer 18 indicates a pressure $P_1$, i.e., about $10^{-2}$ Torr. Such pressure differential can be readily attained by proper adjustment of the system 13*a*, for example, as shown, the valve 21 is closed while the valve 20 is open so as to achieve the desired pressure relation $P_1 > P_2$.

The pressure $P_2$ in the reaction chamber 2*a* must be maintained lower than that in the container 17 so that a carrier gas, containing vaporized dopant can flow at sufficient volume through conduit 13 to impinge on the melt zone 7.

Control of the amount of dopant gas delivered to the melt zone is achieved as follows:

1. Fill the constant volume chamber 22 by opening valve 20 and closing valve 21;
2. Close valves 21 ad 22 so as to isolate a given volume of dopant gas therein;
3. Release the isolated volume of dopant gas by opening valve 21 while maintaining valve 20 closed.

Figure 2:
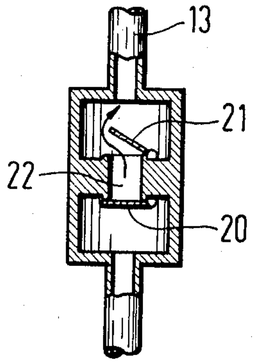
FIG. 2 is a partial elevated sectional view of a combination of valves and constant volume chamber utilizing the practice of the invention.

The above described step 3 is illustrated at FIG. 2. As shown, the pressure of the given volume of gaseous dopant material is adjusted to a new value $P_{2a}$ as it passes from the constant volume chamber 22 to conduit 13. If desired, a plurality of such pressure adjustments can be provided so that the pressure $P_{2a}$ of a given volume of gaseous dopant material gradually approaches the pressure $P_2$ surrounding a crystal melt zone.

An increase in valve operational steps 1–3 set forth above, per unit time causes an increase in the amount of gaseous dopant material that is removed from the container 17. Further, increasing the volume capacity of constant volume chamber 22 causes an increase in pressure differential between the values of $P_1$ and $P_2$.

The volume of gaseous dopant moved during an operation can be determined by the formula:

$$V = (n)(t)(V_{22})(1 - P_2/P_1)$$

wherein:

$n$ is the number of valve operations per unit time;
$t$ is the unit time;
$V_{22}$ is the given volume of chamber 22;
$P_1$ is the pressure within reaction housing 2*a;*
$P_2$ is the pressure within container 22; and
$V$ is the volume of gaseous dopant moved.

When the pressure within the container 17 and the reaction chamber 2*a* is adjusted so that $P_2 << P_1$, (i.e., when $P_2$ is negligible in relation to $P_1$) then the following relation exists: $V = (n)(t)(V_{22})$.

The vaporized or decomposed doping material is transported to the melt zone 7 and incorporated within the semiconductor rod 4. The recrystallized rod portion 6 thus has a concentration of doping material therein. The concentration of a dopant within a semiconductor member is primarily dependent upon the following parameters:

1. The pressure of the carrier gas and the temperature within the dopant container 17;
2. The given volume of the constant volume chamber 22 and the number of valve operations per unit time of the valve, such as 20 and 22, wich may range from 1 to 50 operations per second; and
3. The pressure differential between $P_1$ and $P_2$.

By proper selection of a program that either maintains the above parameters at a constant value or selectively adjusts the values thereof, a select or constant dopant concentration within a semiconductor crystal is readily achieved. The invention can be serially interconnected with additional zone melt operation to provide a higher crystal order within doped semiconductor crystals.

Figure 3:
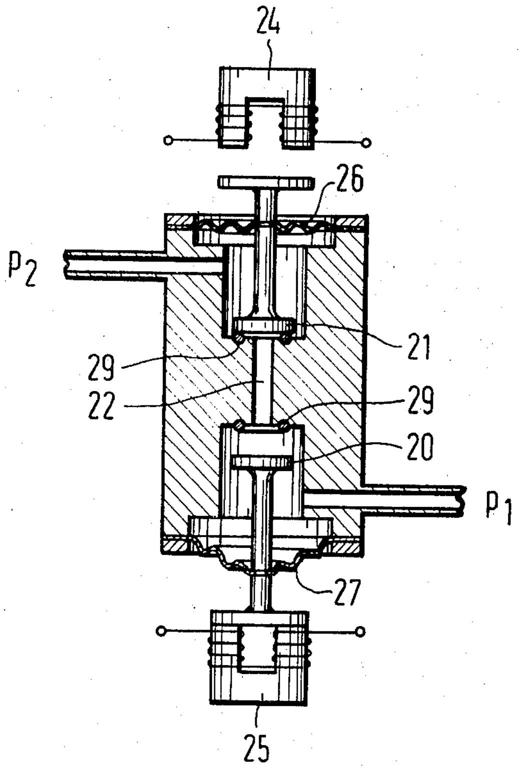
FIG. 3 is a partial elevated sectional view of an exemplary embodiment of an electromagnetically controlled double valve system utilizing the practice of the invention.

FIG. 3 illustrates an exemplary embodiment of system 13*a* that is comprised of an electromagnetically controlled double valve arrangement that is especially useful in the practice of the invention. As shown, conduit 13*b*receives a gas at a pressure $P_1$ and conduit 13*c* allows a gas at a pressure $P_{2a}$ to exit. As indicatedd earlier, $P_1$ is the pressure within the dopant container, such as 17 and $P_{2a}$ is a pressure above the pressure $P_2$ surrounding a crystal melt zone and below the pressure $P_1$.

The electromagnetically controllable double valve arrangement comprises a body having the constant volume chamber 22 arranged between opposing valves 21 and 20. A pair of elecromagnets 24 and 25 are positioned in working relation with vlves 20 and 21 respectively so that a proper signal causes the electromagnets to open or close the valves 21 and 20. Each valve 21 and 20 is provided with a flexible bellow means 26 and 27 respectively and with gaskets 29. As shown, valve 21 is closed and valve 20 is open, i.e., as during the first step of a valve operation.

Figure 4:
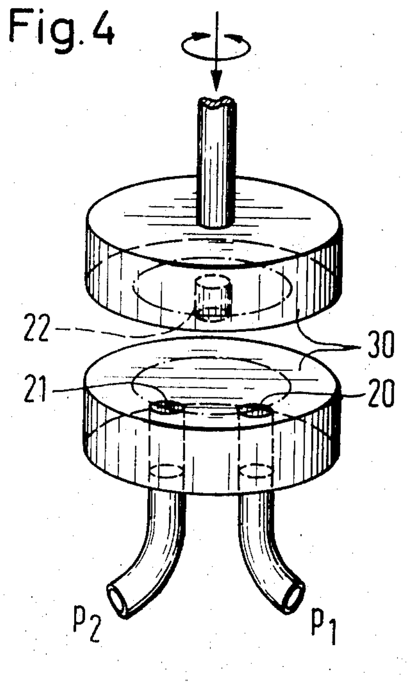
FIG. 4 is an exploded view, partially in phantom, illustrating an exemplary form of a rotary controlled double valve system utilizing the practice of the invention.

FIG. 4 illustrates, in an exploded view, a further exemplary embodiment of system 13*a* that comprises a rotary controlled double valve arrangement. Similar elements as those shown in FIGS. 1 and 2 are designated with the same reference numerals. The contiguous surfaces of the valve portions are provided with a gasket means 30 to prevent the gas from escaping therebetween.

Figure 5:
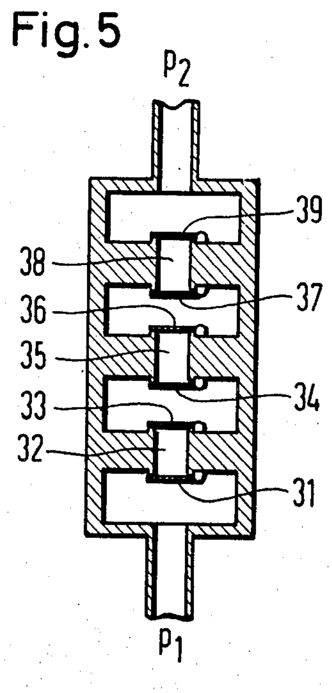
FIG. 5 is a view similar to that of FIG. 3 and shows an exemplary form of a multi-stage valve system utilized in the practice of the invention.
Figure 6:
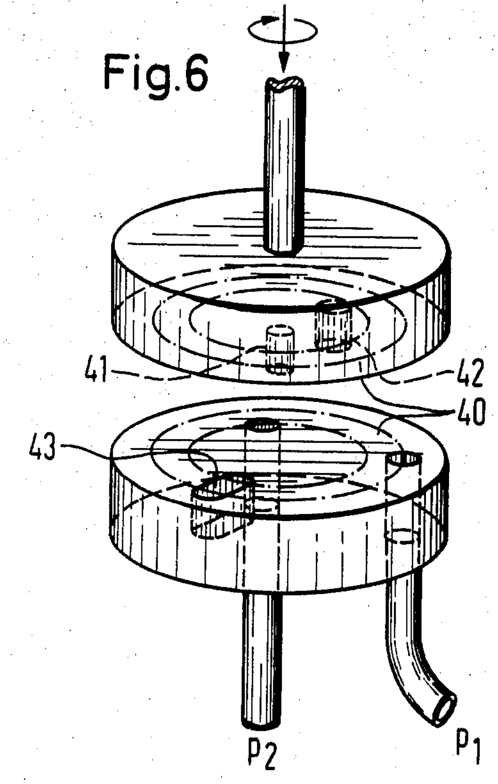
FIG. 6 is a somewhat similar view as that of FIG. 4 and shows an exemplary form of a rotary controlled multi-stage valve system utilized in the practice of the invention.

Further exemplary embodiments of the system 13*a* in the form of multi-stage valve arrangements are illustrated at FIGS. 5 and 6. Multi-stage valve arrangements increase the dilution factor of the gaseous dopant and thus assure a more uniform concentration of dopant delivered to a melt zone.

In the schematic illustration at FIG. 5, the valve operation comprises a sequential activation of valves 31,33,34,36, 37 and 39. Constant volume chambers 32,35 and 38 are located between each pair of valves. In addition to increase the dilution factor, such multi-stage valve arrangements are preferred over the double valve arrangements shown at FIGS. 1–3 because arcing or the like at the induction heating coil of a floating melt zone apparatus is substantially avoided by a gradual decrease of the initial high pressure $P_1$ to a value that approaches the lower pressure $P_2$ (i.e., by a briefly occurring very high pressure).

FIG. 6 shows an exploded view of a rotary conrolled multi-stage valve arrangement. As shown, an upper portion of the arrangement is provided with a pair of constant volume chambers 41 and 42 located on concentric orbits 41*a* and 42*a* respectively. The lower portion of the valve arrangement includes a conduit 13*c* and 13*b* mounted in alignment with the inner and outer orbits 41*a* and 42*a*respectively and a bridging passage 43 interconnecting the orbits 41*a* and 42*a* with each other. Reference numeral 40 designates a gasket surface. During operation, the upper portion is rotated so that chamber 41 is in communication with conduit 13*b*via passage 43 to receive a given volume of gaseous dopant. Further, rotation of the upper portion seals the chamber 41 from the conduit 13*b* and additional rotation provides a communiction with chamber 42 via passage 43. Further rotational movement of the upper portion brings chamber 42 into communication with conduit 13*c* for delivery of the dopant to the crystal melt zone. This type of valve arrangement allows an extremely precise control of very small volumes of gaseous dopant material.

As is apparent from the foregoing specification, the present invention is susceptible of being embodied with various alterations and modifications which may differ particularly from those that have been described in the preceding specification and description. For this reason it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. An apparatus for controlled diffusion of a doping material into a semiconductor crystal including:

a. a housing having a gas impermeable reaction chamber therein and a gas inlet and a gas outlet;
b. movable mounting means positioned within said reaction chamber along opposite surfaces thereof for supporting said crystal therebetween;
c. a heating means within said reaction chamber surrounding a portion of said crystal so as to define a melt zone thereon;
d. a doping material container positioned remote from said reaction chamber having a supply of a vaporizable doping material therein and a means for maintaining said doping material at a constant temmperature;
e. a conduit interconnecting said reaction chamber and said doping material container, said conduit having one end thereof terminating in the vicinity of said crystal melt zone;
f. a combination of at least two valves having a constant volume chamber therebetween located within said conduit and between said reaction chamber and said doping material container and said valves each comprising of a confining wall of said chamber;
g. a means for opening and closing said valve in accordance with a select program; and
h. a means for adjusting the pressure within said reaction chamber and within said doping material container.

2. An apparatus as defined in claim 1 including a gas expansion chamber located within the conduit between said reaction chamber and said combination of at least two valves having a constant volume chamber therebetween.

3. An apparatus as defined in claim 1 wherein said combinaation comprises electromagnetically controlled multi-stage valves.

4. An apparatus as defined in claim 1 whrein said combination comprises rotary controlled multi-stage valves.

5. An apparatus as defined in claim 1 wherein said combination comprises a rotary controlled double valve.

6. An apparatus as defined in claim 1 wherein said valves are acutated by a mechanical means.

7. An apparatus as defined in claim 1 including a high vacuum pump connected to said reaction chamber and to the doping material container and a pressure adjustment means connected to said doping material container so that a pressure differential between said chamber and said container can be established.

* * * * *